(12) United States Patent
Winterer et al.

(10) Patent No.: US 6,433,280 B2
(45) Date of Patent: Aug. 13, 2002

(54) HANDLING AND MOUNTING PROTECTION DEVICE

(75) Inventors: Jürgen Winterer, Pettendorf; Bernd Stadler, Donaustauff, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/820,248

(22) Filed: Mar. 28, 2001

Related U.S. Application Data

(63) Continuation of application No. PCT/DE99/03022, filed on Sep. 22, 1999.

(30) Foreign Application Priority Data

Sep. 28, 2001 (DE) .......................................... 198 44 461

(51) Int. Cl.$^7$ ................................................. H05K 5/03
(52) U.S. Cl. ........................... 174/66; 361/759; 361/757
(58) Field of Search .............................. 174/66, 67, 55, 174/56, 57, 256, 59, 17 C, 52.1, 52.2; 220/3.2, 3.3, 3.8, 241; 361/752, 759, 771, 757, 726, 732, 740, 747; 312/215

(56) References Cited

U.S. PATENT DOCUMENTS

| | | | |
|---|---|---|---|
| 4,896,784 A | 1/1990 | Heath | 220/3.2 |
| 4,899,257 A | 2/1990 | Yamamoto | 361/395 |
| 5,531,345 A | 7/1996 | Nakamura et al. | 220/3.8 |
| 5,568,868 A | 10/1996 | Keller et al. | |
| 5,668,698 A | 9/1997 | Jozwiak et al. | 361/752 |
| 5,673,180 A | 9/1997 | Pernet | 361/756 |
| 5,739,475 A | 4/1998 | Fujisawa et al. | 174/153 G |
| 5,942,729 A | 8/1999 | Carlson Jr. et al. | 174/66 |
| 6,058,020 A | 5/2000 | Winterer et al. | 361/767 |
| 6,111,760 A | 8/2000 | Nixon | 361/752 |
| 6,121,548 A | 9/2000 | Matsuoka | 174/59 |
| 6,219,252 B1 | 4/2001 | Tsai | 361/752 |

FOREIGN PATENT DOCUMENTS

| | | |
|---|---|---|
| DE | 196 26 081 A1 | 1/1998 |
| DE | 19626081 | 1/1998 |
| EP | 0 497 534 A2 | 8/1992 |
| EP | 0497534 | 8/1992 |
| EP | 0 548 583 A1 | 6/1993 |
| EP | 0548583 | 6/1993 |
| EP | 0 716 483 A2 | 6/1996 |
| EP | 0716483 | 6/1996 |
| WO | WO97/04632 | 2/1997 |
| WO | 9704632 | 2/1997 |

*Primary Examiner*—Dean A. Reichard
*Assistant Examiner*—Angel R. Estrada
(74) *Attorney, Agent, or Firm*—Laurence A. Greenberg; Werner H. Stemer; Gregory L. Mayback

(57) ABSTRACT

A handling and mounting protection device is described that has a cap-shaped configuration with a covering layer which covers a contact-sensitive upper side of a component which is to be protected. Extending from the covering layer are locking arms with locking hooks which, in the state in which they are fitted onto the component, engage behind undercuts in the component in such a way that even after the component has been mounted they can still be released from it.

1 Claim, 2 Drawing Sheets

HANDLING AND MOUNTING PROTECTION DEVICE

CROSS-REFERENCE TO RELATED APPLICATION

This application is a continuation of copending International Application No. PCT/DE99/03032, filed Sep. 22, 1999, which designated the United States.

BACKGROUND OF THE INVENTION

Field of the Invention

The invention is in the field of handling and mounting technology for sensitive components, in particular vehicle airbag pressure sensors which can be surface mounted. Such sensors have a contact-sensitive upper side which is formed by a gel covering over the actual semiconductor chip. In particular when such components are mounted on a printed circuit board, contact with the gel covering cannot always be prevented. However, contact may adversely affect the satisfactory functioning of such a component that is critical for safety, which cannot be tolerated in many applications.

A wide range of packages are known for sensitive electronic components, these packages being in particular in the form of blister packages or so-called strip packages. Such a strip package, known from International Patent Disclosure WO 97/04632, contains a closable depression in which the component can be stored protected against impacts. For this purpose, the side walls of the depression are in the form of shock-absorbing spring elements. The base point of the side walls is lower here than the bottom of the depression, as a result of which the component introduced into the depression is protected in the packaging strip against mechanical stresses and against contact by an upper covering foil.

However, this protection of the component is provided only during storage and/or transportation; at any rate the protection ends at the time at which the component has to be removed from the strip structure in order to be mounted or individually handled.

SUMMARY OF THE INVENTION

It is accordingly an object of the invention to provide a handling and mounting protection device that overcomes the above-mentioned disadvantages of the prior art devices of this general type, which provides a reliable protection of the contact-sensitive upper side even during the individual handling and mounting of the components described at the beginning.

With the foregoing and other objects in view there is provided, in accordance with the invention, a handling and mounting protection device for a component having a contact-sensitive upper side and undercuts formed therein and disposed lower than the contact sensitive upper side. The handling and mounting protection device contains a cap shaped body formed of a covering layer for covering the contact-sensitive upper side. Locking arms protrude from the covering layer and have locking hooks which, in a state in which they are fitted onto the component, engage the undercuts such that even after the component has been mounted the locking hooks can still be released from the undercuts. Projections protrude from both sides of the covering layer in a region of the locking arms and extend in a plane of the covering layer.

The object is achieved according to the invention with a handling and mounting protection device for a component having a contact-sensitive upper side and a component housing with undercuts that are disposed lower than the upper side. The handling and mounting protection device is of a cap-shaped configuration and has a covering layer which covers the conductor-sensitive upper side and which has locking arms which extend from the covering layer and have locking hooks which, in the state in which they are fitted onto the component, engage behind the undercuts in such a way that even after the component has been mounted they can still be released from it.

An essential aspect of the invention is that the component is reliably protected even during individual handling, in that the individual cap-shaped protection device is assigned to it, preferably until the mounting is completely terminated. The protection device is formed here in such a way that it can still be removed from the component even after the mounting has been completed. As a result, the component is advantageously also protected at the premise of the customer up to the end of mounting and can still be easily connected to the component and released from it by a simple snap-type closure. The protection device is preferably manufactured as a plastic injection-molded part and can be recyclable by virtue of the use of thermoplastic.

A particularly preferred structural configuration of the handling and mounting protection device according to the invention provides for recesses in the material in the junction region between the locking hooks and the covering layer.

Other features which are considered as characteristic for the invention are set forth in the appended claims.

Although the invention is illustrated and described herein as embodied in a handling and mounting protection device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
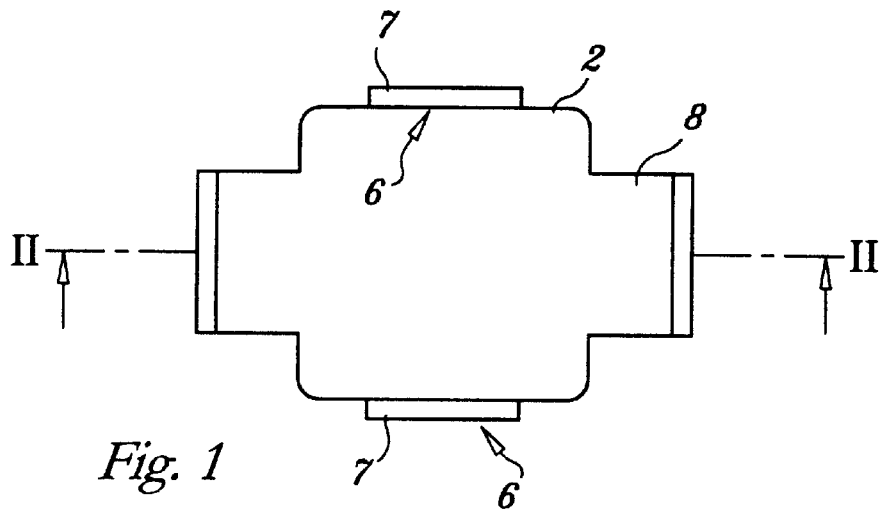
FIG. 1 is a top plan view of a handling and mounting protection device according to the invention.
Figure 2:
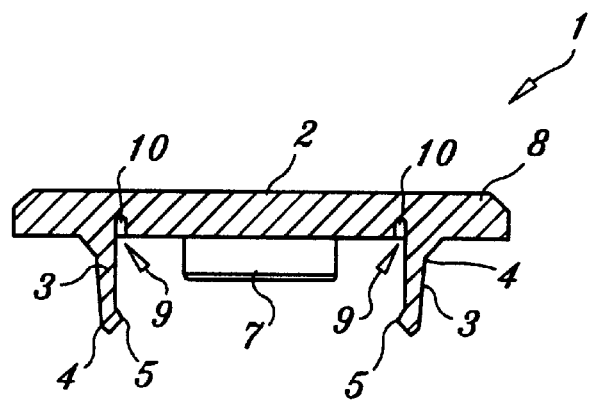
FIG. 2 is a cross-sectional view of the handling and mounting protection device taken along the line II—II shown in FIG. 1.
Figure 3:
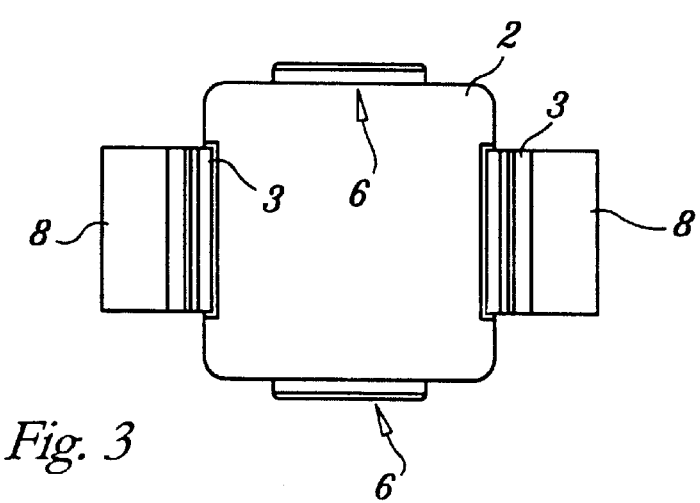
FIG. 3 is a bottom plan view of the handling and mounting protection device.

In all the figures of the drawing, sub-features and integral parts that correspond to one another bear the same reference symbol in each case. Referring now to the figures of the drawing in detail and first, particularly, to FIGS. 1–3 thereof, there is shown a handling and mounting protection device 1 in the form of a cap 1 (see FIG. 2). The device 1 has a covering layer 2 that covers a contact-sensitive upper side of a component 12. Locking arms 3, whose ends 4 are provided with locking hooks 5, extend from the covering layer 2. Securing webs 7 are formed on sides 6 of the covering layer 2 that are offset by, in each case, 90° with respect to the locking hooks 5. In order to handle, in particular apply and remove the cap 1, projections 8 which protrude on each side of the covering layer 2 are provided. Provided in a junction region 9 between the covering layer 2 and the locking arms 3 are, in each case, recesses 10 in the material which facilitate the springing open of the locking arms 3 during mounting and dismounting. The spring properties of the locking arms 3 are thus determined not only by the (preferably plastic) material of the cap 1 but also by the geometric shaping at the junction 9 between the covering layer 2 and locking arms 3.

Figure 4:
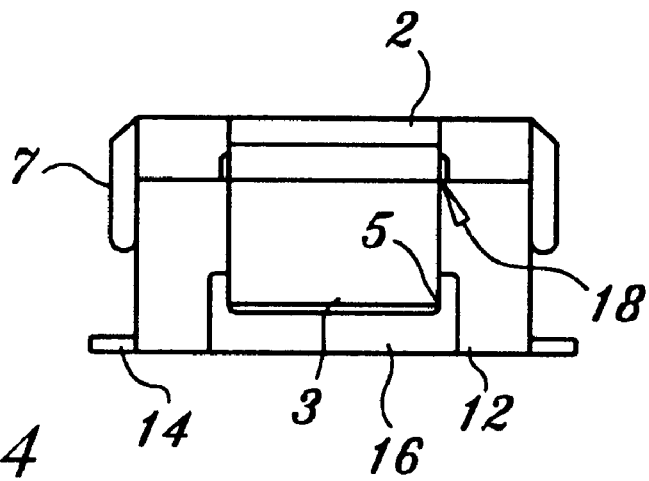
FIG. 4 is a side-elevational view, on a smaller scale, of a component with the handling and mounting protection device.
Figure 5:
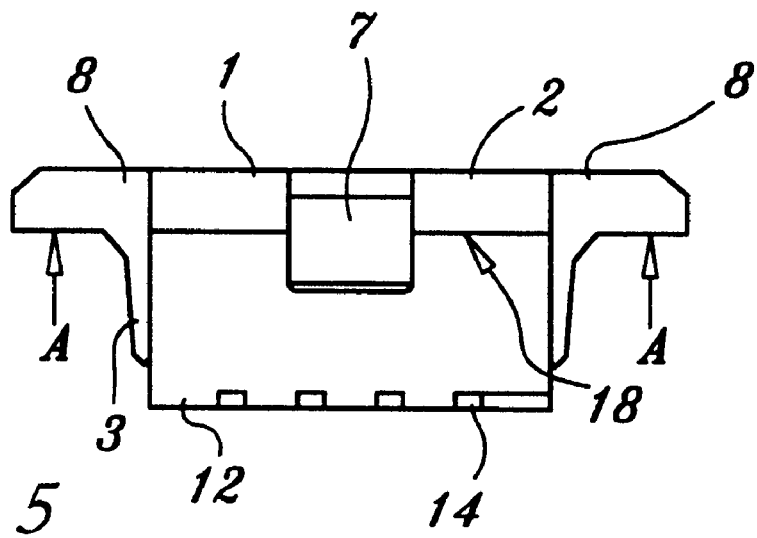
FIG. 5 is a front-elevational view, on a smaller scale, of the component with the handling and mounting protection device.

FIGS. 4 and 5 show the cap 1 which is fitted onto the component 12, the component 12 being constructed with its electrical connections 14 as a component which can be surface mounted (SMD). The locking hooks 5 of the locking arms 3 engage here behind undercuts 16 in the component 12 and thus ensure, together with the spring-elastic properties of the cap 1, a secure and reliable seat of the cap 1 on the component 12. The covering layer 2 of the cap 1 covers a contact-sensitive upper side 18 of the component 12 until the component 12 is soldered on and secured at the desired position, for example on a printed circuit board. The handling and mounting protection device 1 is then easily removed by moving the overhanging parts 8, indicated in FIG. 5 by the arrows A, away from the upper side 18, with the result that the locking hooks 5 move out of the undercuts 16 and the locking of the handling and mounting protection to the component is thus canceled out.

We claim:

1. A handling and mounting protection device for a component having a contact-sensitive upper side and undercuts formed therein and disposed lower than the contact sensitive upper side, the handling and mounting protection device comprising:

a cap shaped body made of a spring-elastic material, including:
   a covering layer for covering the contact-sensitive upper side;
   locking arms protruding from said covering layer and having locking hooks which, in a state in which they are fitted onto the component, engage the undercuts such that even after the component has been mounted the locking hooks can still be released from the undercuts;
   projections protruding from both sides of said covering layer in a region of the locking arms and extending in a plane of said covering layer; and
   a junction region disposed between said locking arms and said covering layer and having a recess formed therein.

* * * * *

UNITED STATES PATENT AND TRADEMARK OFFICE
CERTIFICATE OF CORRECTION

PATENT NO.   : 6,433,280 B2
DATED        : August 13, 2002
INVENTOR(S)  : Jürgen Winterer et al.

It is certified that error appears in the above-identified patent and that said Letters Patent is hereby corrected as shown below:

<u>Title page,</u>
Item [63], should read as follows:
              -- Related U.S. Application Data
Continuation of application No. PCT/DE99/03032. Filed on Sep. 22, 1999. --
Item [30], should read as follows:
              -- Foreign Application Priority Data
Sep. 28, 1998   (DE) ………………………….. 198 44 461.3 --

Signed and Sealed this

Fourth Day of February, 2003

JAMES E. ROGAN
*Director of the United States Patent and Trademark Office*